United States Patent [19]

Cutler

[11] Patent Number: 5,545,976

[45] Date of Patent: Aug. 13, 1996

[54] GATED SPECTRUM ANALYZER

[75] Inventor: Robert T. Cutler, Everett, Wash.

[73] Assignee: Hewlett-Packard Company, Palo Alto, Calif.

[21] Appl. No.: 526,796

[22] Filed: Sep. 11, 1995

Related U.S. Application Data

[63] Continuation of Ser. No. 336,704, Nov. 8, 1994, abandoned, which is a continuation of Ser. No. 32,223, Mar. 17, 1993, abandoned.

[51] Int. Cl.$^6$ .................................................. G01R 23/00
[52] U.S. Cl. ................................. 324/76.38; 324/76.24; 324/76.42; 364/485
[58] Field of Search ................................. 342/94, 95, 96, 342/67; 73/861.25; 364/485, 576; 324/76.24, 76.38, 76.42

[56] References Cited

U.S. PATENT DOCUMENTS

| | | | |
|---|---|---|---|
| 3,983,556 | 9/1976 | Danzer | 342/96 |
| 4,012,730 | 3/1977 | Nicholls | 342/94 |
| 4,459,592 | 7/1984 | Long | 342/94 |
| 4,489,320 | 12/1984 | Lewis | 342/94 |
| 4,686,457 | 8/1987 | Banno | 324/76.24 |
| 4,862,177 | 8/1989 | Wong | 342/95 |
| 4,901,244 | 2/1990 | Szeto | 324/76.24 |
| 4,934,373 | 6/1990 | Angelsen | 73/861.25 |
| 5,148,175 | 9/1992 | Woolfolk | 342/95 |
| 5,269,308 | 12/1993 | Hagiwara | 73/861.25 |
| 5,311,189 | 5/1994 | Nagel | 342/95 |
| 5,313,947 | 5/1994 | Micco | 73/861.25 |

OTHER PUBLICATIONS

"Gated analysis of time–varying signals" Rasmussen & Rasmussen ASME Winter Annual Meeting papers, Dec. 7–12, 1986.

HP Catalog–3582 A Signal Analyzer–pp. 508–510. (published Fall 1982)–1983.

Bruel & Kjaer:"Digital Signal Analysis"–1985–pp. 69–83 (month unavailable).

Bruel & Kjaer:"Digital Signal Analysis"–1985–Reporiet Series–pp. 137–139 & 126, (month unavailable).

*Primary Examiner*—Kenneth A. Wieder
*Assistant Examiner*—Jose M. Solis

[57] ABSTRACT

A narrowband spectrum analyzer separates and analyzes a chosen segment of a periodic signal. The signal to be analyzed is digitized by an A/D converter. A gate generator is configured to trigger on a particular portion of the signal waveform and to identify the beginning and end of the chosen segment. Over the interval of the segment, the gate generator produces a digitized gate sequence. The envelope of this sequence may be rectangular or, preferably, may be that of a particular window function. The digitized signal is multiplied by the gate sequence and the multiplier output is then furnished as a train of gated segments to a signal processor for narrowband (high resolution) spectrum analysis. The length of the train is chosen to enable the signal processor to provide the desired resolution. Provision is made for removal of any DC component in the chosen segment before multiplication to reduce the possibility of aliased spectral terms in the processor output. Presuming that the signal within the segment interval is a portion of an underlying, continuous signal, provision is made for inferring the amplitudes of the components of the continuous signal.

9 Claims, 5 Drawing Sheets

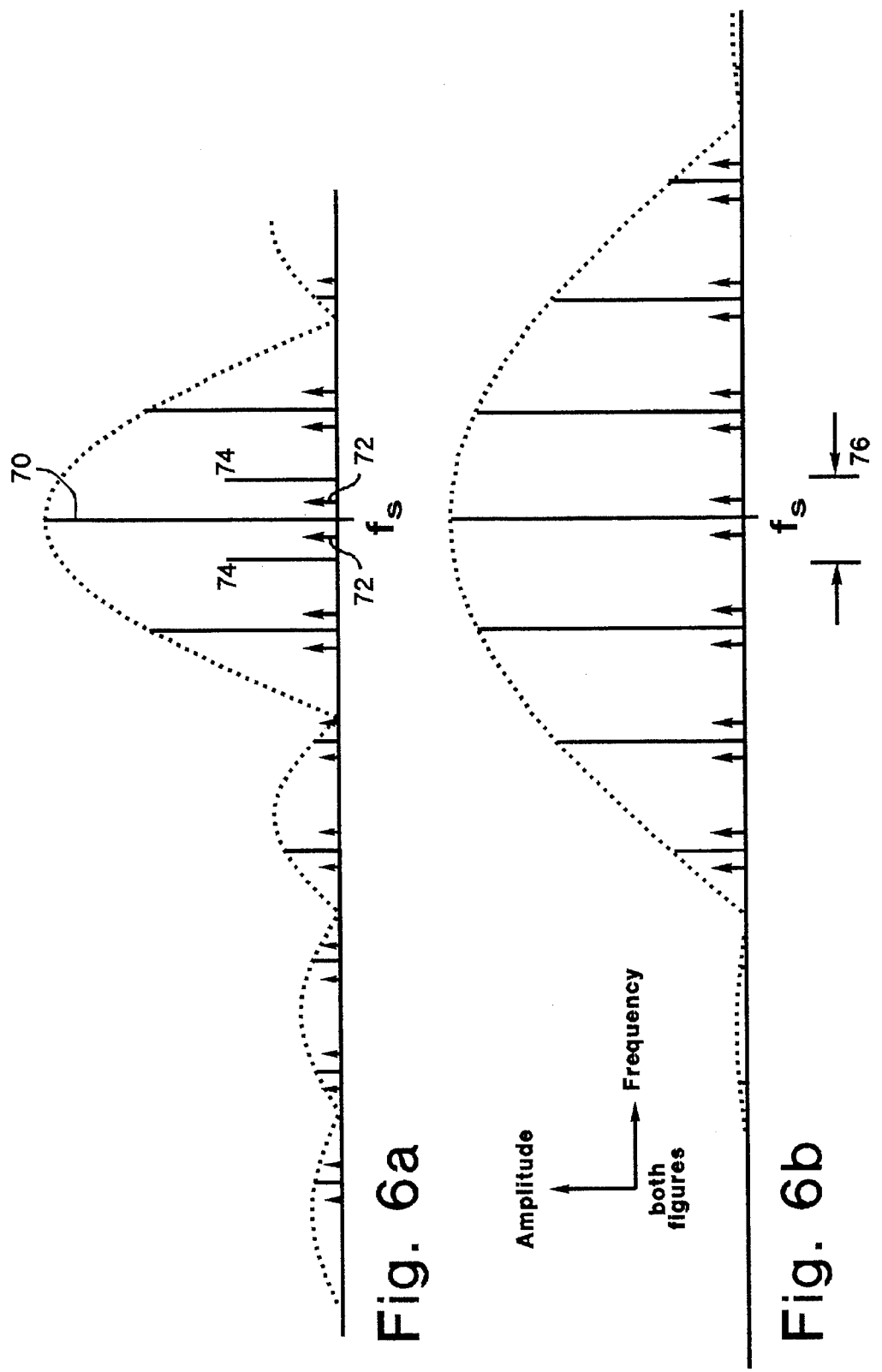

GATED SPECTRUM ANALYZER

CROSS REFERENCE TO RELATED APPLICATION

This is a continuation of application Ser. No. 08/336,704, filed on Nov. 08, 1994, now abandoned; which is a continuation of Ser. No. 08/032,223, filed Mar. 17, 1993, now abandoned.

FIELD OF THE INVENTION

This invention relates to spectrum analysis, and, in particular, to narrowband analysis of the spectrum of a distinct time segment of an essentially periodic signal.

BACKGROUND AND PRIOR ART

Spectrum analyzers are important test instruments applicable to a wide range of technical measurements, primarily electrical and mechanical. As implied by the name, a spectrum analyzer processes an input signal to separate and measure the individual spectral components of the signal, and to order them according to their frequency.

Two types of spectrum analyzers predominate: swept analyzers and FFT (Fast Fourier Transform) analyzers. Parallel-filter analyzers, formerly popular, have largely been superceded by FFT designs. Swept analyzers operate by tuning a filter across the frequency band of interest and measuring the components passing through the filter, associating them with the instantaneous tuning frequency. The tuning action is usually repetitive in order to refresh a dynamic display of the signal components. FFT analyzers, on the other hand, are based on computation: digital data is produced by sampling and digitizing the signal, and computer-like hardware operates on a block of this data to produce information about the frequency composition of the signal.

There is a large class of signals which create analysis problems for both types of analyzers. The class includes periodic signals composed of distinct segments of time, often having distinctive waveforms within each segment. A common example of a signal having such periodic segments is a composite television waveform, such as illustrated in FIG. 1a, which shows one period (about 63 microseconds) of a TV test waveform which generates a single color bar in the center of the TV monitor. Several distinct segments are evident in the illustration: the horizontal sync pulse 2, the color reference "burst" 4, and the color bar signal 6. For such a waveform, both types of analyzers can readily measure the total spectrum of the TV signal. But often what is wanted is, instead, the spectrum of one of the segments of the waveform, such as the color burst 4. More than that, it is often desired to determine the spectrum of the underlying continuous signal, of which the color burst is but a gated sample. Since one often needs to discover certain imperfections, Such as power supply sidebands, in the underlying original signal, narrowband spectrum analysis is needed to distinguish such sidebands from the nearby carrier.

Analyzing the total spectrum of the TV signal of FIG. 1a brings confusion, since it is not at all evident which spectral components are due to the reference burst segment and which are due to the color bar segment in the video portion of the signal. In fact, because the sinusoidal frequency in both segments is the same (3.58 MHz for the U.S. television standard), and because the segments have the same periodicity, their spectral components will coincide in frequency and, therefore, they will be inseparable.

Another example from this class of signal is digital data transmitted in repetitive "frames", with a short synchronizing segment at the beginning of the frame. The spectral energy of the synchronizing segment might be negligible compared with that of the ensuing data and would be indistinguishable in a spectrum plot.

Time gating is the traditional method—used with both major types of spectrum analyzers—for eliminating spectral components due to other parts of the signal. That is, the signal to be analyzed is routed through a switch which is enabled only during the segment of interest. Time gating is intrinsic, of course, in FFT analyzers, which operate on a finite block of data. But it is an add-on feature for swept analyzers. FIG. 2 shows, in block-diagram form, how time gating may be applied to a swept analyzer. A gate generator 22 is triggered by a synchronizing signal 21. The generator is adjusted so that the time position of its control output 27 coincides with the occurrence of the desired segment of the signal. Swept spectrum analyzer 23 is shown partitioned into a heterodyne converter/intermediate frequency section 24 and a detector/display section 26. A-signal-interrupting switch 25 is placed between these sections. Control output 27 enables the switch 25, allowing only the desired signal segment to pass to the detector/display 26.

But time gating does not work well when narrowband analysis is needed. When it is used with a swept analyzer, there is a transient problem: the IF filter must settle before the switch is enabled to pass the signal. This requires a filter bandwidth somewhat greater than the inverse of the segment duration, and this bandwidth is often too wide for the desired frequency resolution. A FFT analyzer has the same problem: its resolution is limited by the inverse of the data block length, which is the time duration of the segment.

Another way of stating the issue is that separating narrowband data in a gated signal, such as the TV example above, requires coherent observation over a time comprising many gated samples, just as would be required were the signal not gated. For instance, to detect high level sidebands spaced 120 Hz from the color subcarrier would require an observation "window" at least 10 milliseconds wide, whether the subcarrier is sampled (i.e., gated) or continuous. This means processing at least 160 periods of the TV waveform. Therefore, the signal must be gated before high-resolution analysis. Prior art techniques have not incorporated this possibility.

SUMMARY OF THE INVENTION

The invention facilitates narrowband spectrum analysis of repetitive signals. It particularly applies to signals composed of temporally separate segments, where at least some segments are gated samples of underlying continuous waveforms. Narrowband spectrum analysis may be performed on the signal within a chosen segment, while excluding energy from other segments of the waveform.

Application of the invention is not limited to strictly periodic signals, but also includes essentially periodic signals. The latter are signals dominated by periodic components, but also containing aperiodic components (like noise), or components of other periodicity.

In an aspect of the invention, a signal to be analyzed is transformed by an A/D converter into an ordered sequence of sampled, digital values. A gate generator is synchronized to the signal period, usually by triggering on a salient portion of either the analog or digitized signal. The range of samples corresponding to the segment of interest is identified, and, over this range, the gate generator produces a gating sequence synchronous with the A/D sequence. The numerical values of the gating sequence are those of a window function. Specific window functions are chosen to reduce the amplitude of spectral sidelobes which are a natural consequence of the gating process. This can reduce or eliminate unwanted spectral terms when signal bandwidths are high. The sequence of signal samples is then multiplied by the gating sequence, resulting in a digital "pulse train" with the same period as the signal, whose values are zero except within the segment of interest. Finally, this pulse train is supplied to a digital processor—typically an FFT analyzer—which computes the spectrum with a resolution which improves as the pulse train lengthens.

In another aspect of the invention, the DC value of the segment of interest is determined. This value is subtracted from the sample values before multiplication. This step reduces possible unwanted signal components called aliases which arise from multiplication of the DC (zero frequency) term.

In yet another aspect of the invention, the amplitude of the (presumed) underlying continuous signal—of which the segment is a gated interval—is inferred. This is accomplished by computing an amplitude correction factor from the shape and duty cycle of the gating sequence, and supplying this factor to the digital processor to correct the computed amplitude.

BRIEF DESCRIPTION OF THE DRAWINGS

FIG. 6a is a plot of the spectrum resulting from the convolution of the spectra of FIGS. 5a and 5b.

FIG. 6b is a plot of the spectrum resulting from the convolution of the spectra of FIGS. 5a and 5c.

DETAILED DESCRIPTION

Refer again to FIG. 1a, a representation of one horizontal period of a composite NTSC television waveform signal and a common example of the class of signals readily analyzed by the preferred embodiment of the invention. The TV signal combines various functions such as scanning sync, color sync, and luminance and chrominance information. Many of these functions are separated in time and form distinct segments of the periodic waveform, such as the horizontal sync segment 2 and the color synchronizing "burst" segment 4. Color sync segment 4 is produced by gating in a few cycles of a master reference at 3.58 MHz. The sinusoidal component in segment 6 comes from a modulator. Its frequency is the same as the reference, but its phase and magnitude represent hue and saturation information. In a standard TV receiver, this composite, repetitive waveform would produce a vertical, colored bar against a black background. The TV waveform is shown as a zero-mean (i.e., AC coupled) signal with a zero baseline 10.

Figure 1A:
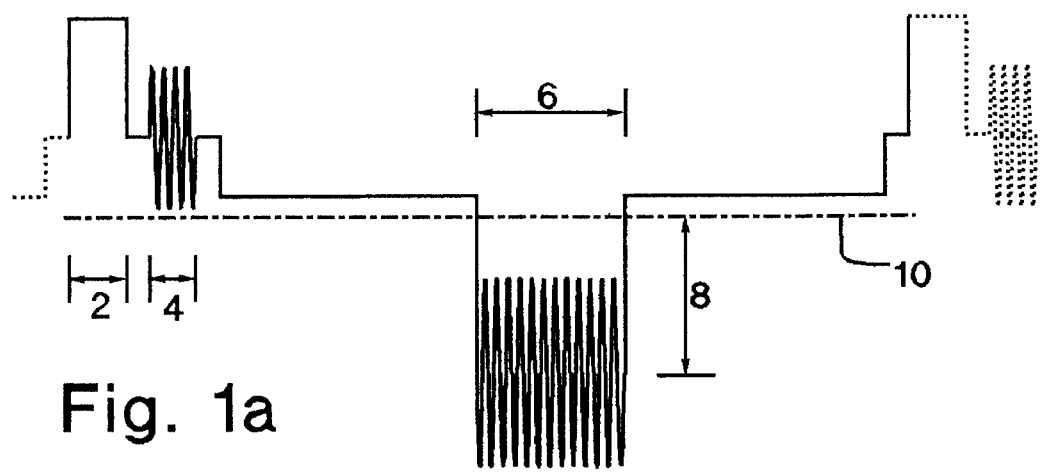
FIG. 1 is an example of a segmented waveform (a) and examples of uniform (b) and Hanning (c) window functions aligned with it, according to the invention.
Figure 3:
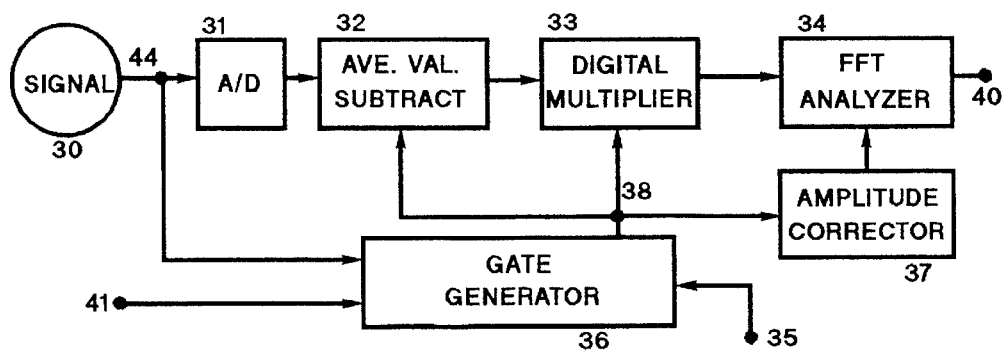
FIG. 3 is a block diagram of a spectrum analyzer according to the present invention.

The block diagram in FIG. 3 illustrates the preferred manner of constructing a spectrum analyzer, according to the invention, which would be capable of narrowband analysis of any segment of the television signal of FIG. 1a.

Figure 1B:
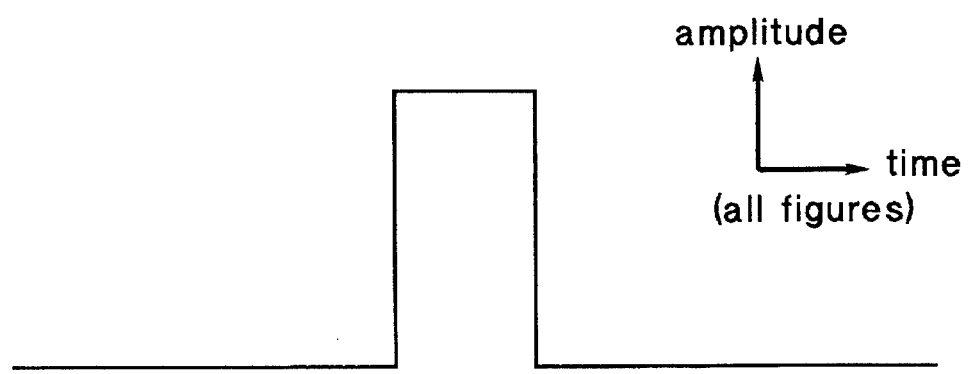
Figure 1C:
Figure 2:
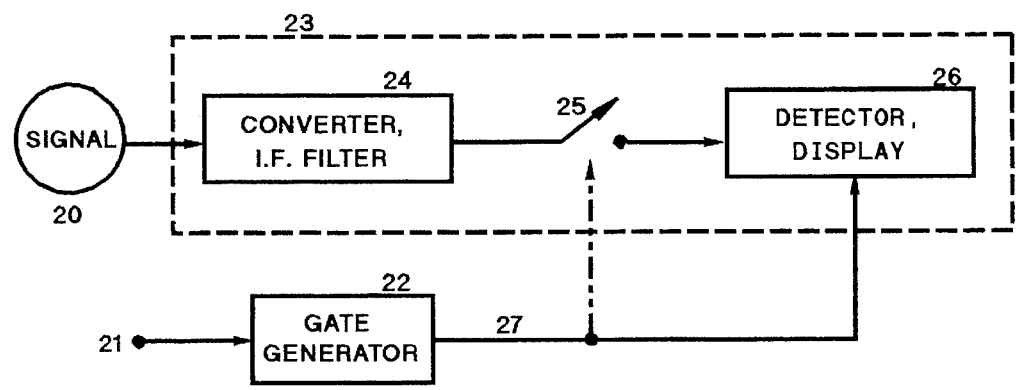
FIG. 2 is a block diagram of a prior-art gated swept spectrum analyzer.

A signal source 30 (not a part of the spectrum analyzer) has an essentially periodic output 44 coupled to an A/D converter 31 and to a gate generator 36. Gate generator 36 also has a control input 35, by which it is configured to trigger on some periodic reference point of the waveform of source 30, such as the sync pulse in segment 2. Alternatively, via control input 35, gate generator 36 may be instructed to trigger on an external reference signal 41. Input 35 also receives control data identifying the beginning and end, relative to the trigger point, of the particular segment of the signal to be analyzed. Using this data, gate generator output 38 provides a sequence of samples whose values trace the shape of a window function over the range of the desired segment. The particular window function may be predetermined, or a desired choice may be included with the control data supplied to input 35. Two possible window functions are illustrated in FIGS. 1b and 1c. FIG. 1b is a "uniform" window, the default case in which the sequence values within the segment time are all equal. FIG. 1c is a Hanning or "raised cosine" window. Values for this window (or any other non-uniform window) are stored in a digital memory section within gate generator 36. An up/down counter addresses the memory and its increment value is adjusted so that the counter ranges from zero to its maximum and return over the number of samples in the segment being analyzed.

The digital output sequence from A/D converter 31 is supplied to an average value subtractor 32, whose function is to subtract, from each A/D output word, the average (DC) value of the signal within the segment of interest. This may be different from the overall signal DC value. The output 38 from gate generator 36 controls the operation of the subtractor. In FIG. 1a, the overall DC value is zero, shown as baseline 10, but segment 6 has a negative DC value 8. Both gate generator output 38 and the output of subtractor 32 are coupled to a digital multiplier 33, which multiplies, in sequence, each pair of samples at its inputs. Its output product is coupled to an FFT analyzer 34.

Amplitude corrector 37 monitors the gate generator sequence at output 38 and computes an amplitude correction factor, which it supplies to FFT analyzer 34.

FFT analyzer 34 has an output 40 for delivering its results to a CRT display, a plotter, or perhaps additional processing, such as demodulation.

Figure 4A:
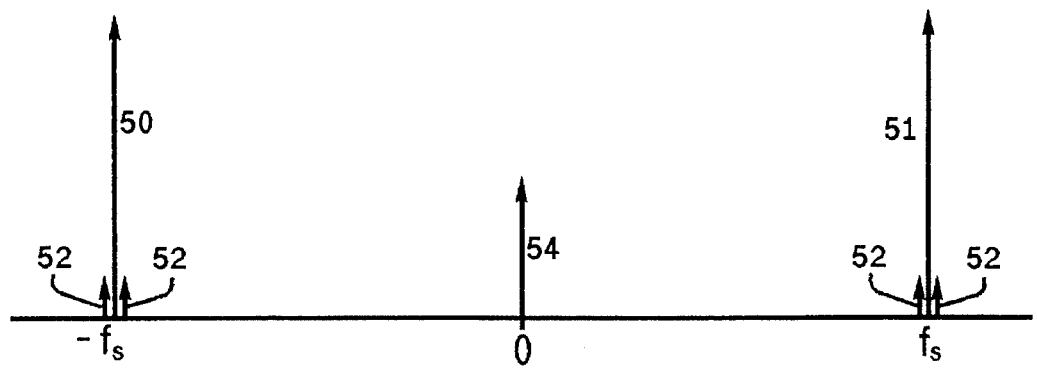
FIG. 4a is a spectrum plot of a signal from which one of the segments of the waveform of FIG. 1a is derived.

To understand how the preferred embodiment functions, consider now FIGS. 4 and 5. FIG. 4a is a plot of both positive and negative frequency terms of an underlying, continuous sinusoidal signal from which segment 6 is derived. The reason for displaying the spectrum of the original underlying signal, rather than that of the segment appearing in the TV waveform is this: the signal at the output of multiplier 33 is a sinusoid that has been subjected to two gating operations. The first is the rectangular gating operation used to produce segment 6 in the composite waveform. The second is the windowing operation being discussed here. If a signal is subjected to two gating operations in sequence, in which one gate shape is contained within the other, clearly the smaller of the two shapes masks the larger.

Thus the gated spectrum is determined from the original signal and the windowing operation.

For illustrating advantages of this embodiment of the invention, assume that the spectrum of the underlying sinusoidal signal of segment 6 is represented in FIG. 4a (not to scale). Positive term 51 and negative term 50 are located at $f_s$ and $-f_s$, respectively, and represent the energy of the sinusoid. ($f_s$ is 3.58 MHz.) Assume for the moment that average value subtractor 32 is not functioning, but is passing through the unmodified A/D output. Zero frequency term 54 represents the average DC value, or pedestal 8, of the pulsed sinusoid. Also evident is an unwanted signal defect: low level sidebands 52 representing phase modulation of the sinusoid at the power supply ripple frequency of 120 Hz. Assuming burst segment 4 does not have similar sidebands, the preferred embodiment is able not only to detect the sidebands, but to determine that they belong to segment 6 and not segment 4. Conventional swept or block-oriented analyzers either could not resolve the close-in sidebands, or could not determine which segment contains them. To resolve these low-level sidebands satisfactorily would require an analysis bandwidth of perhaps 10 Hz. In turn, this means coherent observation times of the order of 0.1 sec, or about 1500 periods of the signal.

Figure 4B:
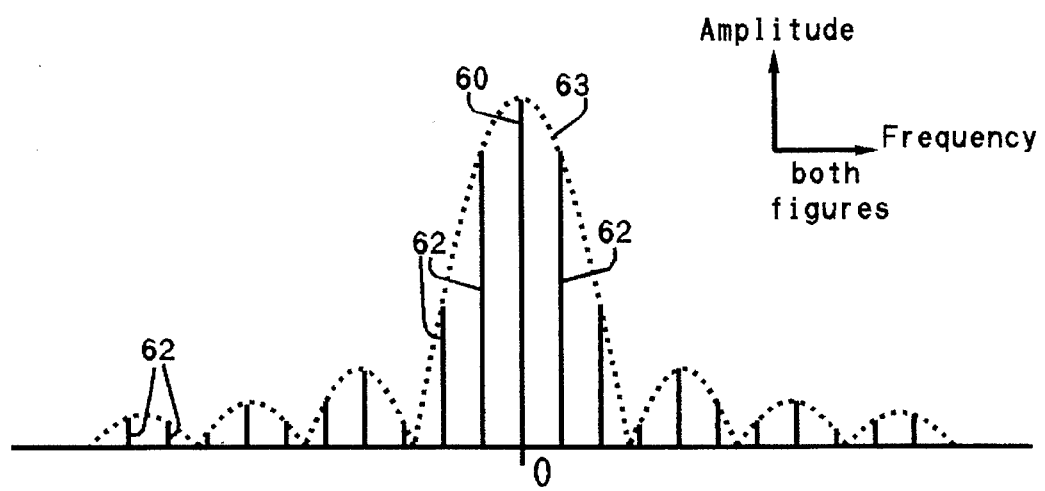
FIG. 4b is a spectrum plot of the window function of FIG. 1b.
Figure 5A:
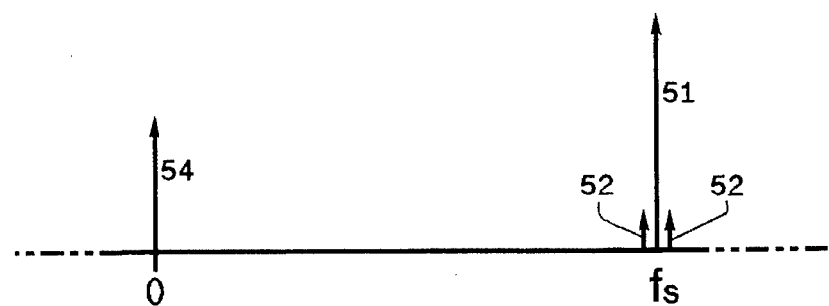
FIG. 5 is a partial illustration of convolution operations between the spectra of the signal of FIG. 1a and the window functions of FIGS. 1b & 1c.
Figure 5B:
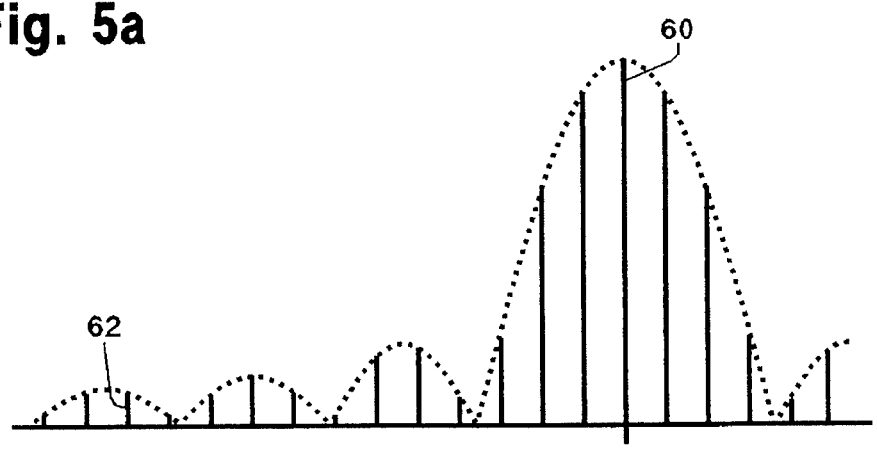

The output of multiplier 33 is the signal whose spectrum is analyzed by FFT analyzer 34. To determine the spectrum of this signal, refer again to FIG. 4. FIG. 4b shows the spectrum of the rectangular window of FIG. 1b. This has the familiar sin(x)/x shape of the spectrum of a rectangular pulse. Because the window function is repetitive, it has a line spectrum, with a principal component 60 at zero frequency, and higher components 62 spaced at harmonics of the horizontal scan frequency, about 15.7 KHz. The output of multiplier 33 is, of course, the product of the window function and the signal. As is well known in the signal processing art, to compute the spectrum of the product of two signals, one convolves their spectra. The convolution is graphically illustrated in FIG. 5 for the positive signal component; the negative operation is symmetrical. FIG. 5b shows the window spectrum of FIG. 4b reversed and displaced a distance of about $f_s$ with respect to the signal spectrum in FIG. 5a. Multiplying the shifting spectra and adding the resultant products will produce the spectrum of the gated segment. However, in this example, unwanted frequencies will also appear in the multiplier output: the DC term 54 will combine with one or more higher components 62 in the third sidelobe of the window spectrum. Terms of this kind which cannot, in general, be filtered from the output are termed "aliases". They will contaminate the computed spectral data in the output of the FFT analyzer.

Although the preferred embodiment illustrates aliases arising from the presence of a DC term, there are other ways for them to occur, as is well-known.

The preferred embodiment employs at least two means for solving the alias problem.

One means is to determine the average (DC) value of the windowed signal and then to subtract this before analysis; this is the function of average value subtractor 32. Thus, depending on the accuracy of this step, the zero frequency term 54 in the spectrum will vanish or be substantially reduced in amplitude.

Figure 5C:
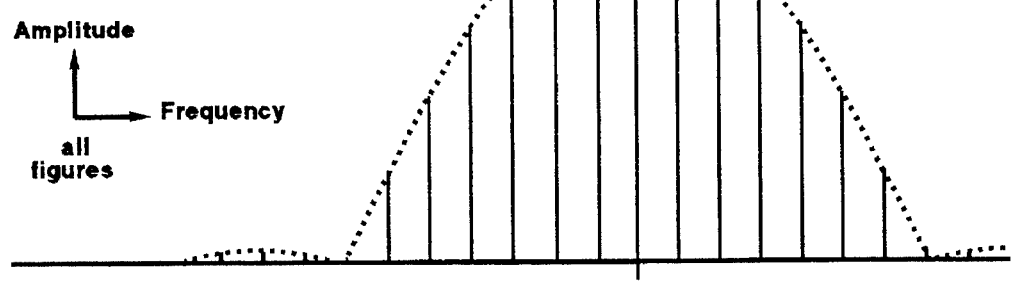

A second means is to use a non-rectangular window shape, such as the Hanning window of FIG. 1c. Such windows, in general, allow for trading increased main lobe bandwidth for a reduction in sidelobe level. The shifted spectrum of the Hanning window is shown in FIG. 5c. The first sidelobe is about 19 dB lower than that of the uniform window, and the remaining sidelobes fall off at 60 dB per decade, vs 20 dB per decade for the uniform window. The increased width of the main lobe is of no consequence in this application, as the FFT analyzer examines only the main output term of the multiplier, together with its close-in sidebands. An auxiliary advantage of the Hanning window is that its sinusoidal numeric values may be easily obtained from the FFT analyzer, which already has such tables stored, so that separate ROM storage within gate generator 36 may not be necessary.

FIG. 6 depicts the spectra resulting from the convolution operations just described. In FIG. 5, the primary signal component 51 is shown with its sidebands 52. Convolving this with the spectrum of the rectangular gating function, FIG. 5b, results in the spectrum of FIG. 6a. Primary component 51 and sidebands 52 are replicated at the spacing of the rectangular gating function components. (Alternate replications have been removed from FIG. 6 to avoid drawing clutter.) The principal replicated signal 70 and sidebands 72 are centered around frequency $f_s$. Also centered around $f_s$ is a pair of components 74, which is the (partial) result of aliasing between the signal DC term 54 and components in the third sidelobe of the gating spectrum FIG. 5b. These aliasing components are greatly suppressed in FIG. 6b, which shows signal 51 convolved with the Hanning spectrum of FIG. 5c which has negligible amplitude near the DC term 54. A narrow band 76 is depicted around $f_s$ for both drawings in FIG. 6. This illustrates the "zoom" analysis band employed in FFT analyzer 34 to examine the underlying signal with its sidebands.

The function of average value subtractor 32 may be achieved in various ways. A preferred method for computing the average value of the desired segment is finding the arithmetic mean: adding all the samples of the segment in one period and dividing by the number of samples. This mean is then subtracted from all the samples of the next period's segment, thus providing a way to track slowly-varying pedestal values.

If amplitude corrector 37 is not used, FFT analyzer 34 computes the actual amplitude of the fundamental component of the pulsed signal at its input. However, if the amplitude of the underlying sinusoid is required, this may be inferred by using the factor supplied by amplitude corrector 37. A preferred manner of determining this factor is to compute the RMS value of the window waveform, normalizing it to the peak value of gate generator 36.

I have described and illustrated the principles of my invention with reference to a preferred embodiment; however, it will be apparent that the invention can be modified in arrangement and detail without departing from such principles. For instance, although gate generator 36 is shown as triggering from analog signal 44, it may readily be configured to trigger from an event in the digitized signal at the output of the A/D converter 31. Thus, it will be recognized that the detailed embodiment is illustrative only, and should not be taken as limiting the scope of my invention. Rather, I claim as my invention all such variations as may fall within the scope and spirit of the included claims and equivalents thereto.

I claim:

1. In an essentially periodic composite time function containing a periodic train of time segments which are samples of an underlying signal, a method for spectrum analysis of the underlying signal which achieves a desired frequency resolution smaller than the inverse of the time duration of a single segment, the method comprising the steps of:

a) converting the composite time function into a first sequence of samples having digitized values;

b) choosing a periodically repeating portion of the composite time function as a reference;

c) identifying, with respect to the reference in each period of the composite time function, those samples of the first sequence corresponding to segments of the periodic train;

d) constructing a second sequence of samples, coincident with the first sequence, having the digitized values of a predetermined window function over the sample range of each segment and the value zero elsewhere;

e) multiplying the sample values of the first sequence by the sample values of the second sequence; and f) spectrally analyzing a length of the product sequence from step (e) sufficient to achieve the desired frequency resolution.

2. A method for spectrum analysis, as recited in claim 1, further including the steps of:

d1) Computing an amplitude correction factor from the shape and duty cycle of the second sequence of samples;

g) applying the amplitude correction factor to the spectral components resulting from step (f).

3. In an essentially periodic composite time function containing a periodic train of time segments which are samples of an underlying signal, a method for spectrum analysis of the underlying signal which achieves a desired frequency resolution smaller than the inverse of the time duration of a single segment, the method comprising the steps of:

a) converting the composite time function into a first sequence of samples having digitized values;

b) obtaining a reference signal having the same period as the composite time function and maintaining a fixed time relationship thereto;

c) identifying, with respect to the reference signal in each period of the composite time function, those samples of the first sequence corresponding to segments of the periodic train;

d) constructing a second sequence of samples, coincident with the first sequence, having the digitized values of a predetermined window function over the sample range of each segment and the value zero elsewhere;

e) multiplying the sample values of the first sequence by the sample values of the second sequence; and f) spectrally analyzing a length of the product sequence from step (e) sufficient to achieve the desired frequency resolution.

4. Apparatus for spectrum analysis of a signal included in an essentially periodic composite time function, wherein the signal is represented in the time function by a periodic train of time segments which are samples of the signal, and the frequency resolution of the analysis is smaller than the inverse of the time duration of a single segment, the apparatus comprising:

an A/D converter, having an input coupled to the composite time function, and an output;

a gate generator having a control input for identifying the beginning and end of each segment, and having a digital output sequence whose values, over the time span of each segment, are those of a predetermined window function and are zero elsewhere;

an average value subtractor having an input coupled to the A/D converter output, a control input coupled to the gate generator output, and an output;

a digital multiplier, having a first input coupled to the subtractor output, a second input coupled to the gate generator output, and an output; and a spectrum analyzer having an input coupled to the digital multiplier output.

5. Apparatus for spectrum analysis, as recited in claim 4, further comprising an amplitude corrector, having an input coupled to the gate generator output for determining an amplitude correction factor from the gate sequence, and an output coupled to the spectrum analyzer.

6. Apparatus for spectrum analysis, as recited in claim 4, in which the gate generator is triggerable on a periodically repeating reference portion of the composite time function.

7. Apparatus for spectrum analysis, as recited in claim 4, in which the gate generator is triggerable on a periodically repeating reference portion of the A/D converter output.

8. Apparatus for spectrum analysis, as recited in claim 4, in which the gate generator is triggerable by an external reference signal.

9. Apparatus for spectrum analysis, as recited in claim 4, in which the spectrum analyzer is a Fourier analyzer.

\* \* \* \* \*